United States Patent
Baek et al.

(10) Patent No.: US 12,550,342 B2
(45) Date of Patent: Feb. 10, 2026

(54) METHOD OF FABRICATING A SEMICONDUCTOR DEVICE

(71) Applicant: Samsung Electronics Co., Ltd., Suwon-si (KR)

(72) Inventors: Jiye Baek, Suwon-si (KR); Yi Rang Lim, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 497 days.

(21) Appl. No.: 18/295,433

(22) Filed: Apr. 4, 2023

(65) Prior Publication Data

US 2024/0038829 A1 Feb. 1, 2024

(30) Foreign Application Priority Data

Jul. 27, 2022 (KR) .................. 10-2022-0093150

(51) Int. Cl.
*H01L 21/3213* (2006.01)
*H01L 21/285* (2006.01)
*H10D 1/68* (2025.01)

(52) U.S. Cl.
CPC ....... *H10D 1/692* (2025.01); *H01L 21/28556* (2013.01); *H01L 21/32135* (2013.01)

(58) Field of Classification Search
CPC .......... H10D 1/716; H10D 1/68; H10D 1/692; H10B 12/033; H01L 21/32134; H01L 21/32135
See application file for complete search history.

(56) References Cited

U.S. PATENT DOCUMENTS

| | | | |
|---|---|---|---|
| 8,017,491 B2 | 9/2011 | Lee et al. | |
| 9,059,331 B2 | 6/2015 | Park et al. | |
| 10,854,463 B2 | 12/2020 | Takahashi | |
| 11,069,768 B2 | 7/2021 | Park et al. | |
| 2009/0065896 A1 | 3/2009 | Hwang | |
| 2020/0212169 A1 | 7/2020 | Kim | |
| 2020/0403062 A1* | 12/2020 | Park | H10B 12/30 |
| 2021/0384194 A1 | 12/2021 | Woo et al. | |
| 2021/0408225 A1 | 12/2021 | Seo et al. | |
| 2022/0037461 A1 | 2/2022 | Cho et al. | |
| 2024/0030278 A1 | 1/2024 | Park et al. | |

FOREIGN PATENT DOCUMENTS

KR 10-2024-0014278 A 2/2024

* cited by examiner

*Primary Examiner* — John A Bodnar
(74) *Attorney, Agent, or Firm* — Fish & Richardson P.C.

(57) ABSTRACT

A method for fabricating a semiconductor device includes sequentially stacking a sacrificial layer and a support layer on a substrate, forming bottom electrodes penetrating the sacrificial layer and the support layer to come into contact with the substrate, patterning the support layer to form a support pattern that connects the bottom electrodes to each other, removing the sacrificial layer to expose surfaces of the bottom electrodes, depositing a conductive layer on the exposed surfaces of the bottom electrodes and a surface of the support pattern, and etching the conductive layer. The etching the conductive layer includes selectively removing the conductive layer on the support pattern to expose the surface of the support pattern. The depositing the conductive layer and the etching the conductive layer are alternately performed in a same chamber.

20 Claims, 15 Drawing Sheets

METHOD OF FABRICATING A SEMICONDUCTOR DEVICE

CROSS-REFERENCE TO RELATED APPLICATION

This U.S. nonprovisional application claims priority under 35 U.S.C § 119 to Korean Patent Application No. 10-2022-0093150 filed on Jul. 27, 2022 in the Korean Intellectual Property Office, the disclosure of which is hereby incorporated by reference in its entirety.

BACKGROUND

The present inventive concepts relate to a method of fabricating a semiconductor device, and more particularly, to a method of fabricating a semiconductor device including a capacitor.

Semiconductor devices have an important role in the electronic industry because of their small size, multi-functionality, and/or low fabrication cost. The semiconductor devices are being highly integrated with the remarkable development of the electronic industry. Line widths of patterns of semiconductor devices are being reduced for high integration thereof. However, new exposure techniques and/or expensive exposure techniques are required for fineness of the patterns such that it is difficult to highly integrate the semiconductor device. Various studies have thus recently been conducted for new integration techniques.

SUMMARY

Some example embodiments of the present inventive concepts provide a method of fabricating a compact-sized semiconductor device.

The object of the present inventive concepts is not limited to the mentioned above, and other objects which have not been mentioned above will be clearly understood to those skilled in the art from the following description.

According to some example embodiments of the present inventive concepts, a method of fabricating a semiconductor device includes sequentially stacking a sacrificial layer and a support layer on a substrate, forming bottom electrodes penetrating the sacrificial layer and the support layer to come into contact with the substrate, patterning the support layer to form a support pattern that connects the bottom electrodes to each other, removing the sacrificial layer to expose surfaces of the bottom electrodes, depositing a conductive layer on the exposed surfaces of the bottom electrodes and a surface of the support pattern, and etching the conductive layer. The etching the conductive layer includes selectively removing the conductive layer on the support pattern to expose the surface of the support pattern. The depositing the conductive layer and the etching the conductive layer may be alternately performed in a same chamber.

According to some example embodiments of the present inventive concepts, a method of fabricating a semiconductor device may include providing a dielectric layer including an opening on a substrate, forming bottom electrode contacts in the opening of the dielectric layer, the bottom electrode contacts being in contact with a top surface of the substrate, sequentially stacking a first sacrificial layer, a first support layer, a second sacrificial layer, and a second support layer on the dielectric layer, forming bottom electrodes penetrating the first sacrificial layer, the first support layer, the second sacrificial layer, and the second support layer to come into contact with the bottom electrode contacts, forming a mask on the second support layer to pattern the second support layer, the second sacrificial layer, and the first support layer, removing the first sacrificial layer and the second sacrificial layer to expose the bottom electrodes, depositing a conductive layer on surfaces of the bottom electrodes, a surface of the first support layer, and a surface of the second support layer, performing an etching process on the conductive layer, the etching process being in-situ performed after the conductive layer is deposited, forming a capacitor dielectric layer surrounding the first support layer, the second support layer, and the conductive layer, and forming a top electrode on the capacitor dielectric layer. After depositing the conductive layer and etching the conductive layer, the conductive layer remains on the surfaces of the bottom electrode and is removed from the surface of the first support layer and the surface of the second support layer. The s etching the conductive layer is performed with a gaseous compound including at least one of fluorine (F) or chlorine (Cl).

According to some example embodiments of the present inventive concepts, a method of fabricating a semiconductor device includes stacking a sacrificial layer and a support layer on a substrate, forming bottom electrodes penetrating the sacrificial layer and the support layer, patterning the support layer to form a support pattern, removing the sacrificial layer to expose the bottom electrodes, depositing a conductive layer on surfaces of the bottom electrodes and a surface of the support pattern, etching the conductive layer to expose the surface of the support pattern, and forming a dielectric layer on an exposed surface of the conductive layer and the exposed surface of the support pattern. The depositing the conductive layer includes depositing the conductive layer by atomic layer deposition. The etching the conductive layer includes etching the conductive layer by atomic layer etching. An etch rate of the conductive layer on the support pattern is higher than an etch rate of the conductive layer on the bottom electrode.

DETAIL PARTED DESCRIPTION OF EMBODIMENTS

The following will now describe a semiconductor device and a method of fabricating the same according to the present inventive concepts in conjunction with the accompanying drawings.

When an element is referred to as being "connected to" or "electrically connected to" another element, the element may be directly connected to the other element, or one or more other intervening elements may be present. In contrast, when an element is referred to as being "directly connected to" another element there are no intervening elements present.

When the words "about" and "substantially" are used in this application in connection with a numerical value, it is intended that the associated numerical value include a tolerance of ±10% around the stated numerical value, unless otherwise explicitly defined. Further, regardless of whether numerical values are modified as "about" or "substantially," it will be understood that these values should be construed as including a of ±10% around the stated numerical value.

Figure 1:
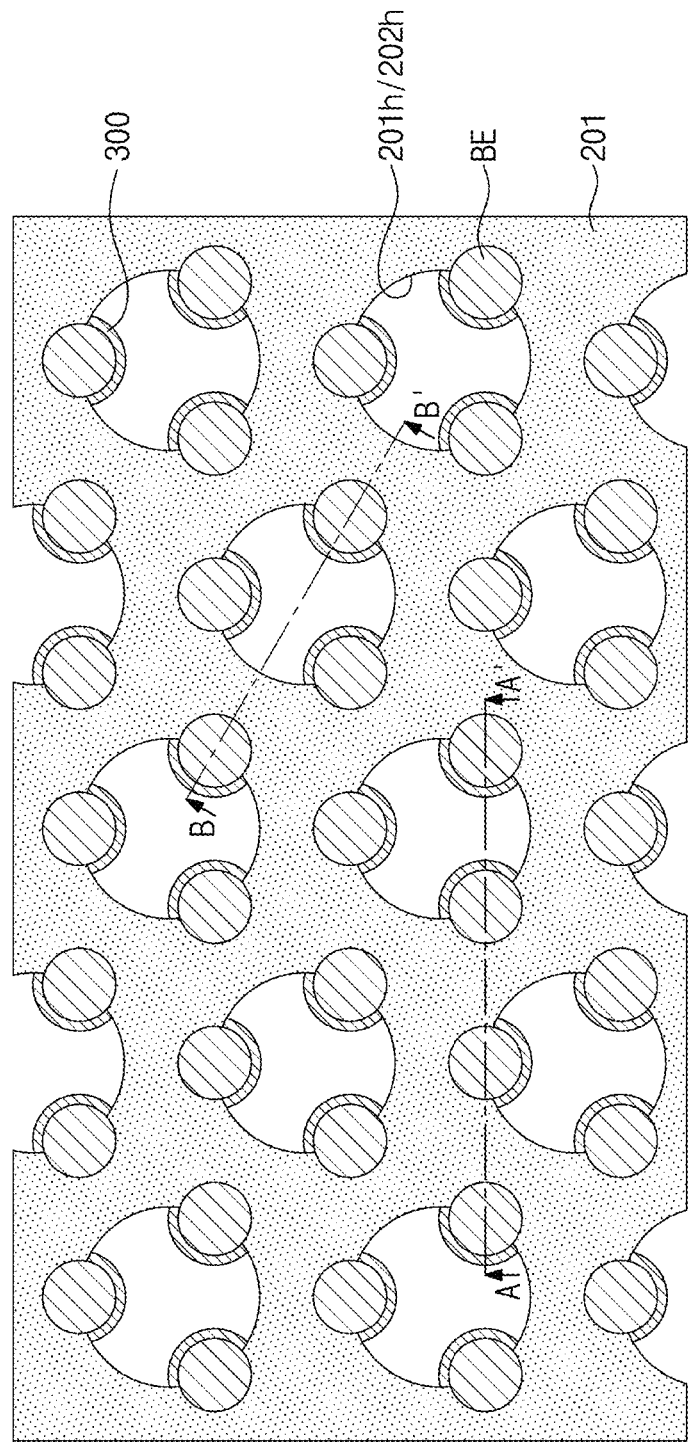
FIG. 1 illustrates a plan view showing a semiconductor device according to some example embodiments of the present inventive concepts.
Figure 2:
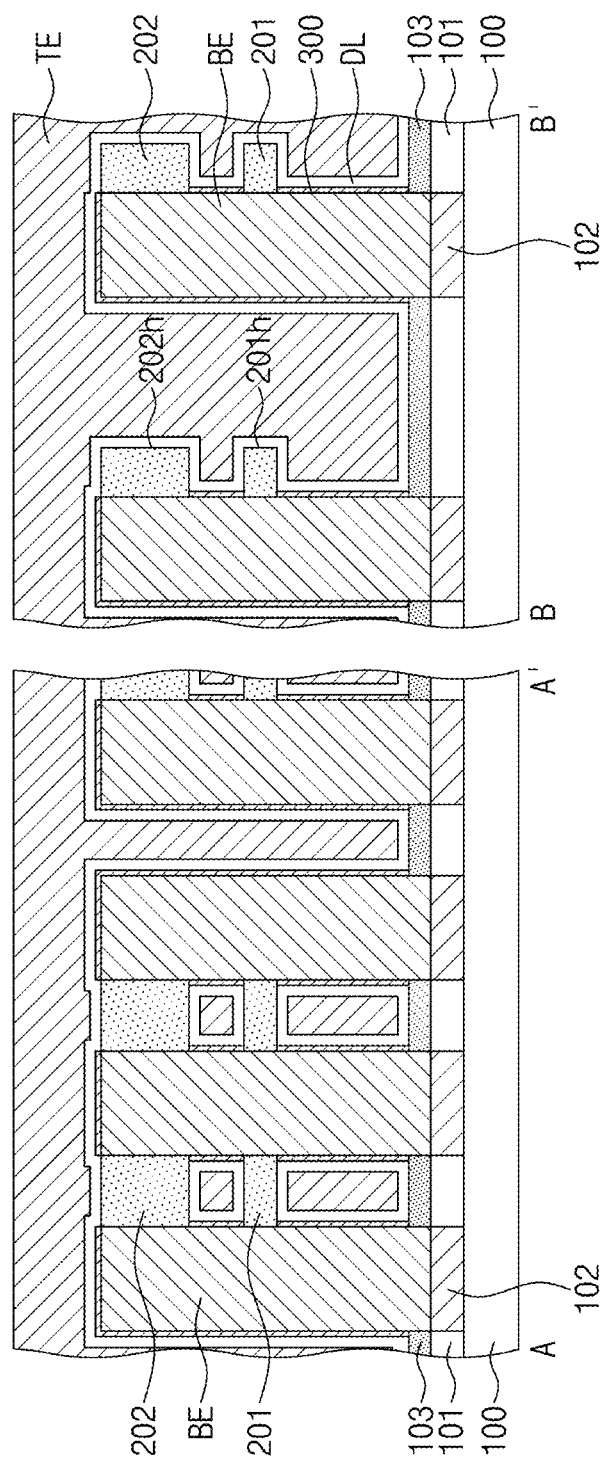
FIG. 2 illustrates a cross-sectional view taken along lines A-A' and B-B' of FIG. 1, showing a semiconductor device according to some example embodiments of the present inventive concepts.

FIG. 1 illustrates a plan view showing a semiconductor device according to some example embodiments of the present inventive concepts. FIG. 2 illustrates a cross-sectional view taken along lines A-A' and B-B' of FIG. 1, showing a semiconductor device according to some example embodiments of the present inventive concepts.

Referring to FIGS. 1 and 2, a semiconductor substrate 100 may be provided. For example, the semiconductor substrate 100 may be a monocrystalline silicon (Si) substrate.

Although not shown, a semiconductor element may be provided on the semiconductor substrate 100. For example, a device isolation layer may be disposed on the semiconductor substrate 100, defining active sections. Word lines may be buried in the semiconductor substrate 100. A source region and a drain region may be provided to include impurity regions disposed in the semiconductor substrate 100 on opposite sides of each, or one or more, of the word lines. Bit lines may be electrically connected to the impurity regions on sides of the word lines. Storage node contacts may be electrically connected to the impurity regions to which the word lines are not connected. The semiconductor element discussed above is by way of example only, and according to some example embodiments of the present inventive concepts, the semiconductor substrate 100 may be provided thereon with variously shaped elements or wiring lines.

An interlayer dielectric layer 101 may be provided on the semiconductor substrate 100. When the semiconductor element is provided on the semiconductor substrate 100, the interlayer dielectric layer 101 may cover the semiconductor element on the semiconductor substrate 100. The interlayer dielectric layer 101 may include a dielectric material. For example, the interlayer dielectric layer 101 may include silicon oxide ($SiO_2$), silicon nitride (SiN), and/or silicon oxynitride (SiON).

The interlayer dielectric layer 101 may be provided with bottom electrode contacts 102 therein. The bottom electrode contacts 102 may penetrate the interlayer dielectric layer 101 to come into electrical connection with the semiconductor substrate 100. For example, when the semiconductor element is provided on the semiconductor substrate 100, the bottom electrode contacts 102 may be electrically connected to the storage node contacts of the semiconductor element. The bottom electrode contacts 102 may include a conductive material. For example, the bottom electrode contacts 102 may include impurity-doped polysilicon, titanium nitride (TiN), and/or tungsten (W).

An etch stop layer 103 may be disposed on the interlayer dielectric layer 101. The etch stop layer 103 may be formed of a single layer or multiple layers including, for example, at least one selected from silicon nitride (SiN), silicon boron nitride (SiBN), and/or silicon carbon nitride (SiCN). According to some example embodiments, the etch stop layer 103 may not be provided as needed.

The etch stop layer 103 may be provided with bottom electrodes BE thereon. Each, or one or more, of the bottom electrodes BE may penetrate the etch stop layer 103 to contact one of the bottom electrode contacts 102. The bottom electrodes BE may have a pillar shape. The bottom electrodes BE may have a plug shape with circular cross section. The bottom electrodes BE may be disposed to constitute a honey comb shape when viewed in plan. For example, six bottom electrodes BE may be placed to constitute a hexagon around one single bottom electrode BE. Alternatively, a planar arrangement of the bottom electrodes BE may be variously provided as needed. The bottom electrodes BE may include a conductive material. For example, the bottom electrodes BE may include impurity-doped polysilicon, metal, metal oxide, or metal nitride. In some example embodiments, the bottom electrodes BE may include titanium nitride (TiN).

A first support pattern 201 and a second support pattern 202 may be provided on lateral surfaces of the bottom electrodes BE. The first support pattern 201 and the second support pattern 202 may be in contact with the lateral surfaces of the bottom electrodes BE. The first support pattern 201 may be vertically spaced apart from the interlayer dielectric layer 101 and/or the etch stop layer 103. The first support pattern 201 may be positioned above the etch stop layer 103. The second support pattern 202 may be vertically spaced apart from the first support pattern 201. The second support pattern 202 may be positioned above the first support pattern 201. The second support pattern 202 may have a top surface located at a level from the semiconductor substrate 100 higher than a level of a top surface of the first support pattern 201. The top surface of the second support pattern 202 may be coplanar with those of the bottom electrodes BE. For example, the top surface of the second support pattern 202 and the top surfaces of the bottom electrodes BE may be connected to each other on a plane. The first support pattern 201 and/or the second support pattern 202 may connect the lateral surfaces of the bottom electrodes BE to each other. Therefore, the bottom electrodes BE may be supported by the first support pattern 201 and/or the second support pattern 202. The first support pattern 201 and/or the second support pattern 202 may be formed of a single layer or multiple layers including, for example, at least one selected from silicon nitride (SiN), silicon boron nitride (SiBN), and/or silicon carbon nitride (SiCN).

The first support pattern 201 and/or the second support pattern 202 may have support holes 201h and/or 202h. The first support pattern 201 may have first support holes 201h. The second support pattern 202 may have second support holes 202h. The first support holes 201h may vertically overlap corresponding second support holes 202h. The first support holes 201h and the second support holes 202h may partially expose lateral surfaces of the neighboring bottom electrodes BE.

A conductive layer 300 may cover a surface of each, or one or more, of the bottom electrodes BE, which surface is not in contact with any of the first support pattern 201 and/or the second support pattern 202. For example, the conductive layer 300 may be in contact with the top surface and/or a portion of the exposed lateral surface of each, or one or more, of the bottom electrodes BE. The conductive layer 300 may expose the first support pattern 201 and/or the second support pattern 202 without covering the first support pattern 201 or the second support pattern 202. In addition, the conductive layer 300 may not cover, but expose the etch stop layer 103. When viewed in plan as shown in FIG. 1, the conductive layer 300 may be positioned inside the first support holes 201h. An adhesive force between the bottom electrodes BE and the first and/or second support patterns 201 and 202 may be greater than that between the conductive layer 300 and the first and/or second support patterns 201 and 202. The conductive layer 300 may have a thickness equal to or less than about 10 Å. For example, the conductive layer 300 may have a thickness of about 3 to 4 Å. The conductive layer 300 may be formed to have a thickness that is generally uniform as a whole. The conductive layer 300 may include a conductive material. A work function of material included in the conductive layer 300 may be greater than that of material included in the bottom electrode BE. In this description, the work function may indicate energy, such as heat or light, required, or sufficient, to outwardly discharge an electron from the surface of metal or of a semiconductor. The conductive layer 300 may include niobium (Nb), tantalum (Ta), tin (Sn), molybdenum (Mo), titanium (Ti), indium (In), nickel (Ni), cobalt (Co), tungsten (W), and/or ruthenium (Ru).

A dielectric layer DL may be disposed on the conductive layer 300, the first support pattern 201, and/or the second support pattern 202. The dielectric layer DL may conformally cover the conductive layer 300, the first support pattern 201, and/or the second support pattern 202. For example, the dielectric layer DL may have a uniform thickness to cover the conductive layer 300, the first support pattern 201, and/or the second support pattern 202. The dielectric layer DL may be spaced apart from the bottom electrodes BE with the conductive layer 300 interposed therebetween. The conductive layer 300 may not allow the dielectric layer DL to contact the bottom electrodes BE. The dielectric layer DL may include a dielectric material. The dielectric layer DL may include a material whose dielectric constant is greater than that of silicon oxide ($SiO_2$) or silicon nitride (SiN). For example, the dielectric layer DL may be formed of a single layer or multiple layers of metal oxide, such as aluminum oxide ($Al_2O_3$), zirconium oxide ($ZrO_2$), and/or hafnium oxide ($HfO_2$).

A top electrode TE may be provided on the dielectric layer DL. On the dielectric layer DL, the top electrode TE may cover the bottom electrodes BE. The dielectric layer DL may separate the top electrode TE from the bottom electrodes BE. The top electrode TE may be formed of a single layer or multiple layers including at least one selected from titanium nitride (TiN), metal such as tungsten (W), and/or impurity-doped polysilicon. The conductive layer 300, the bottom electrodes BE, the dielectric layer DL, and/or the top electrode TE may constitute a plurality of capacitors.

According to some example embodiments of the present inventive concepts, the conductive layer 300 may be provided to cover the exposed surfaces of the bottom electrodes BE. The bottom electrodes BE may be provided with the conductive layer 300 on their surfaces that are not in contact with any of the first support pattern 201 and the second support pattern 202, which conductive layer 300 has a work function greater than that of the bottom electrode BE. Therefore, an electron may be difficult to escape from a surface of the conductive layer 300 having a high work function, and thus no electron or fewer electrons may be discharged from the conductive layer 300, which may result in a reduction in leakage current. In this sense, as the bottom electrodes BE are provided on their surfaces with the conductive layer 300 whose work function is relatively high compared to a work function of the bottom electrodes BE, and as the dielectric layer DL is spaced apart from the bottom electrodes BE whose work function is relatively low compared to the work function of the conductive layer 300, electrons stored in the bottom electrodes BE may be difficult to escape therefrom through the dielectric layer DL. Therefore, leakage current may be reduced in a semiconductor device, and the bottom electrodes BE may favorably maintain electrons that are electrical information stored therein. In addition, because the conductive layer 300 covers the bottom electrodes BE, and because the conductive layer 300 covering its corresponding bottom electrode BE is not connected to each other, an electrical short may be reduced, or prevented, between the bottom electrodes BE. Accordingly, there may be provided a semiconductor device whose electrical properties are improved.

Moreover, as the first support pattern 201 and/or the second support pattern 202 are present in contact with the bottom electrodes BE, the bottom electrodes BE may be reduced, or prevented, from collapse, and as a result a device may increase in reliability.

Figure 3:
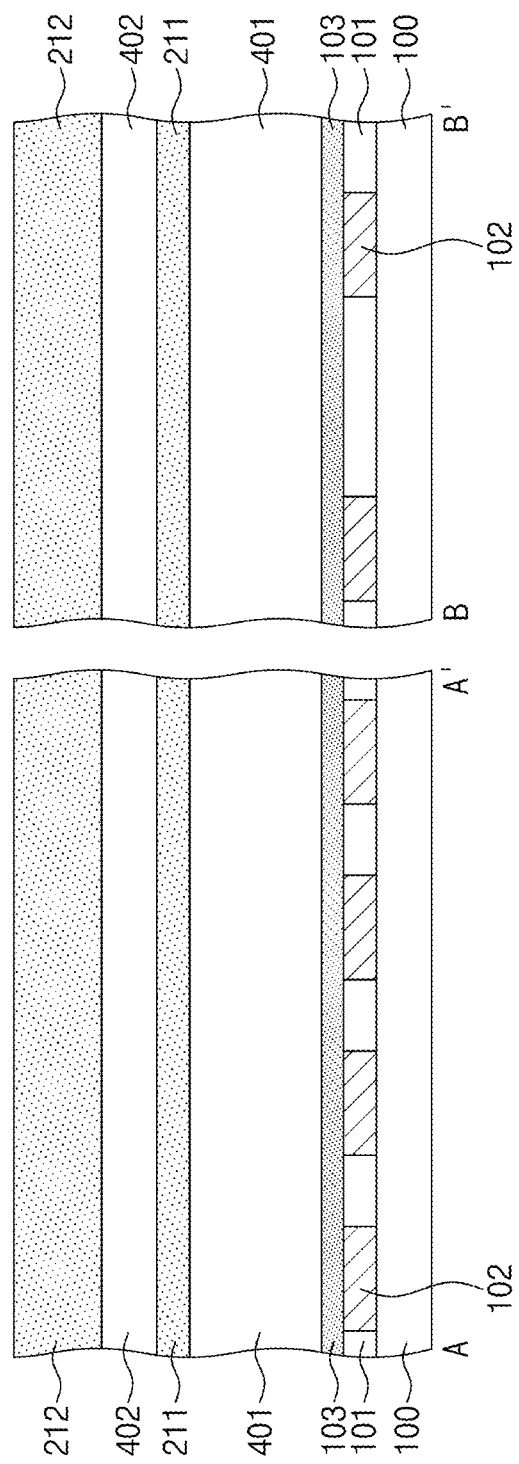
FIGS. 3 to 11 illustrate cross-sectional and plan views showing a method of fabricating a semiconductor device according to some example embodiments of the present inventive concepts.
Figure 4:
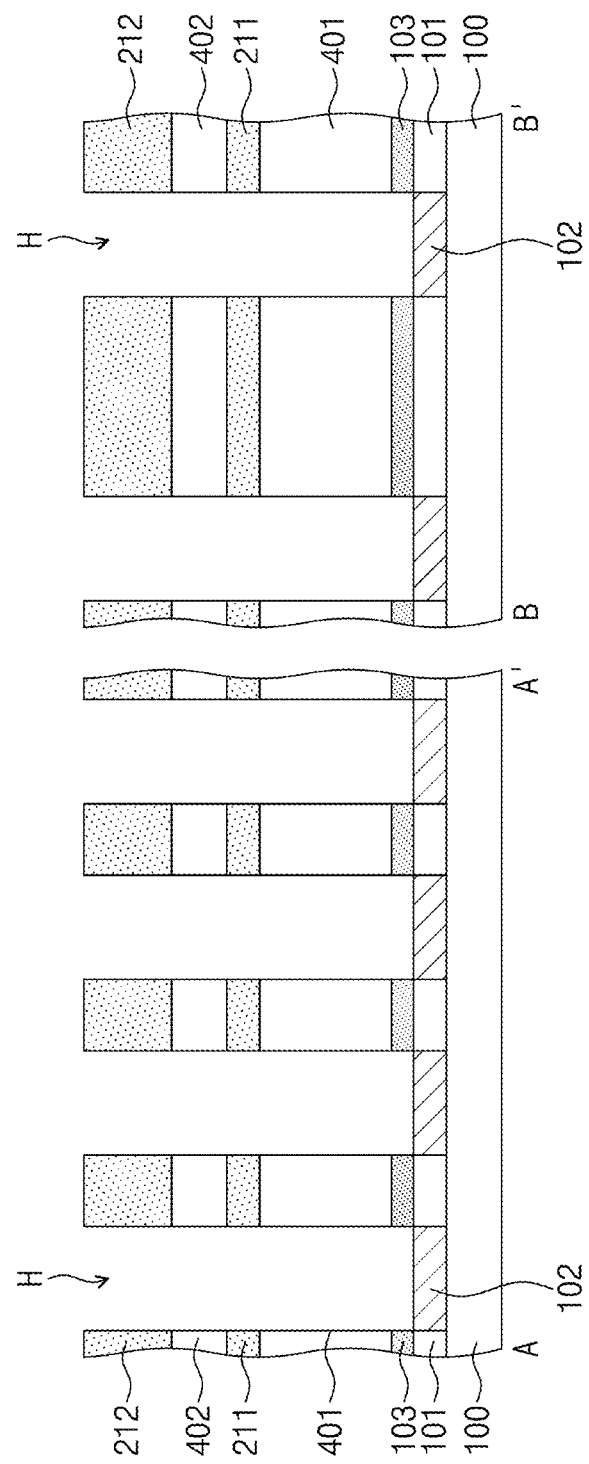
Figure 5:
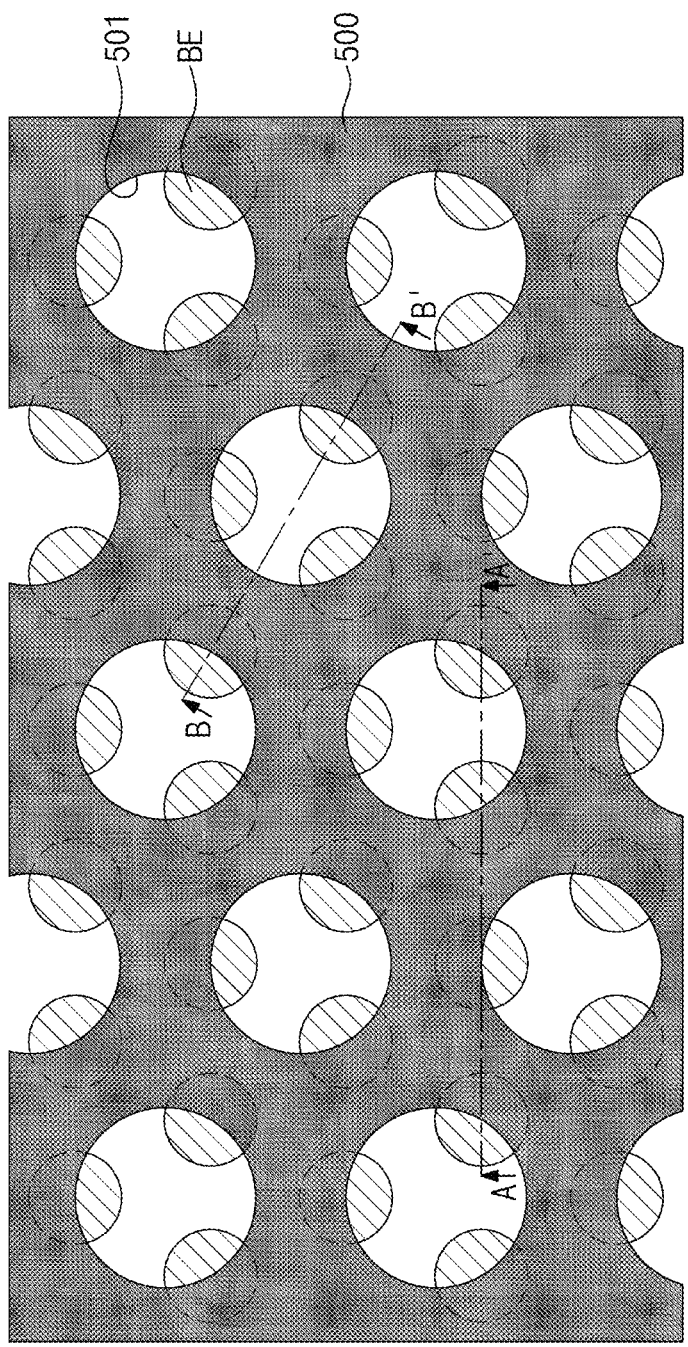

FIGS. 3 to 11 illustrate cross-sectional and plan views showing a method of fabricating a semiconductor device according to some example embodiments of the present inventive concepts. FIG. 5 illustrates a plan view showing a semiconductor device according to some example embodiments of the present inventive concepts. For convenience of description, the same reference numerals may be allocated to components the same as those of the semiconductor device discussed with reference to FIGS. 1 and 2.

Referring to FIG. 3, a semiconductor substrate 100 may be provided. Although not shown, a typical procedure may be employed to form a semiconductor element or wiring lines on the semiconductor substrate 100.

An interlayer dielectric layer 101 may be formed on the semiconductor substrate 100. The interlayer dielectric layer 101 may cover the semiconductor element or the wiring lines on the semiconductor substrate 100.

Bottom electrode contacts 102 may be formed in the interlayer dielectric layer 101. For example, openings may be formed to vertically penetrate the interlayer dielectric layer 101, and then the openings may be filled with a conductive material to form the bottom electrode contacts 102. In some example embodiments, the bottom electrode contacts 102 may be electrically connected to the semiconductor element.

An etch stop layer 103 may be formed on the interlayer dielectric layer 101 and the bottom electrode contacts 102. On the interlayer dielectric layer 101, the etch stop layer 103 may cover the bottom electrode contacts 102.

Sacrificial layers 401 and/or 402 and/or support layers 211 and/or 212 may be formed on the etch stop layer 103. The formation of the sacrificial layers 401 and/or 402 and/or the support layers 211 and/or 212 may include sequentially stacking a first sacrificial layer 401, a first support layer 211, a second sacrificial layer 402, and/or a second support layer 212.

The first sacrificial layer 401 and the second sacrificial layer 402 may be formed of the same material. The first support layer 211 and the second support layer 212 may be formed of the same material. The first sacrificial layer 401 and/or the second sacrificial layer 402 may be formed of a material having an etch selectivity with respect to the first support layer 211 and/or the second support layer 212. For example, the first sacrificial layer 401 and/or the second sacrificial layer 402 may be formed of silicon oxide ($SiO_2$), and the first support layer 211 and/or the second support layer 212 may be formed of a single layer or multiple layers including at least one selected from silicon nitride (SiN), silicon boron nitride (SiBN), and/or silicon carbon nitride (SiCN).

Referring to FIG. 4, the second support layer 212, the second sacrificial layer 402, the first support layer 211, and/or the first sacrificial layer 401 may be sequentially etched to form bottom electrode holes H that expose the bottom electrode contacts 102. For example, a mask pattern may be formed on the second support layer 212, and then the mask pattern may be used as an etching mask to form the bottom electrode holes H. Afterwards, the mask pattern may be removed.

Figure 6:
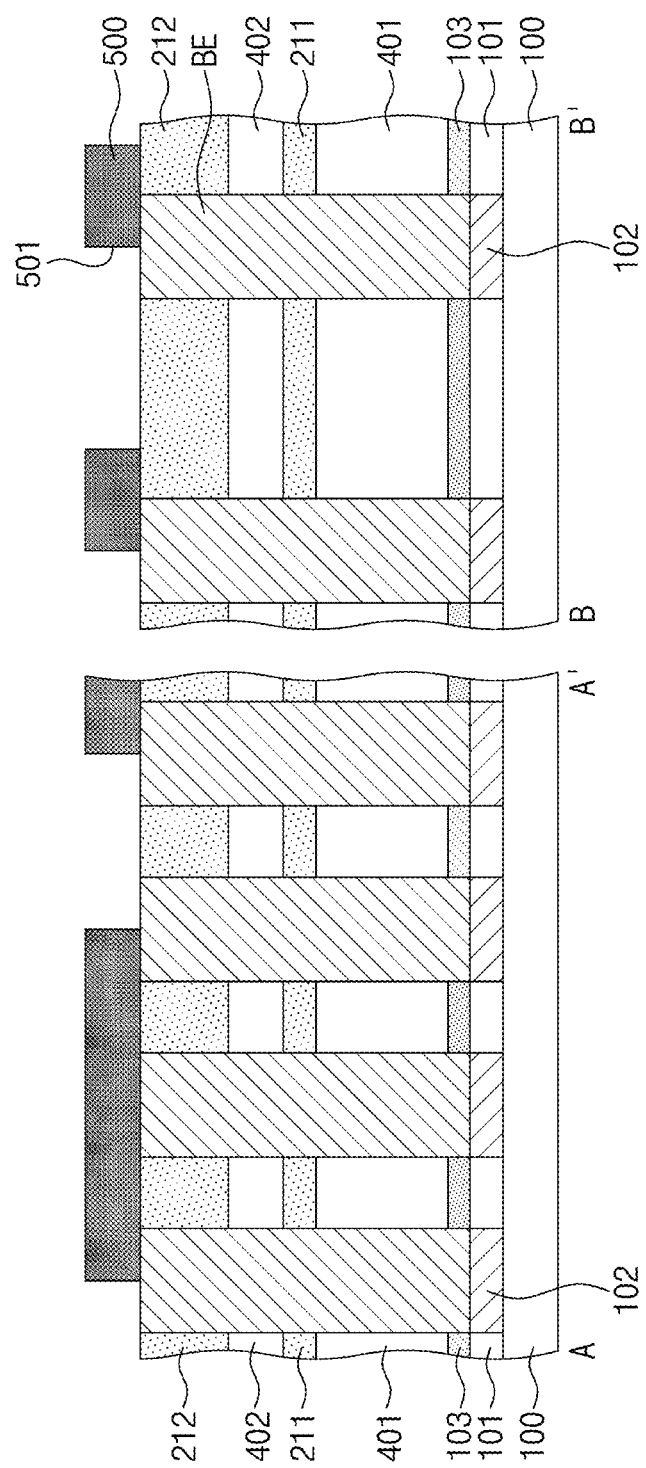

Referring to FIGS. 5 and 6, bottom electrodes BE may be formed in the bottom electrode holes H. For example, a conductive material may be deposited on an entire surface of the semiconductor substrate 100 to form a conductive material layer that fills the bottom electrode holes H, and then an etch-back process may be performed on the conductive material layer to form the bottom electrodes BE. The etch-back process may continue until a top surface of the conductive material layer is located at the same level as that of a top surface of the second support layer 212. Therefore, portions of the conductive material layer that are positioned in the bottom electrode holes H may be separated from each other, and the portions of the conductive material layer may constitute the bottom electrodes BE. The etch-back process may remove the conductive material layer from the top surface of the second support layer 212, and thus the top surface of the second support layer 212 may be exposed.

A mask pattern 500 may be formed on the second support layer 212. The mask pattern 500 may include openings 501 that partially expose the top surfaces of the bottom electrodes BE. For example, each, or one or more, of the openings 501 may partially expose the top surfaces of three neighboring bottom electrodes BE and/or the top surface of the second support layer 212 between the three neighboring bottom electrodes BE.

Figure 7:
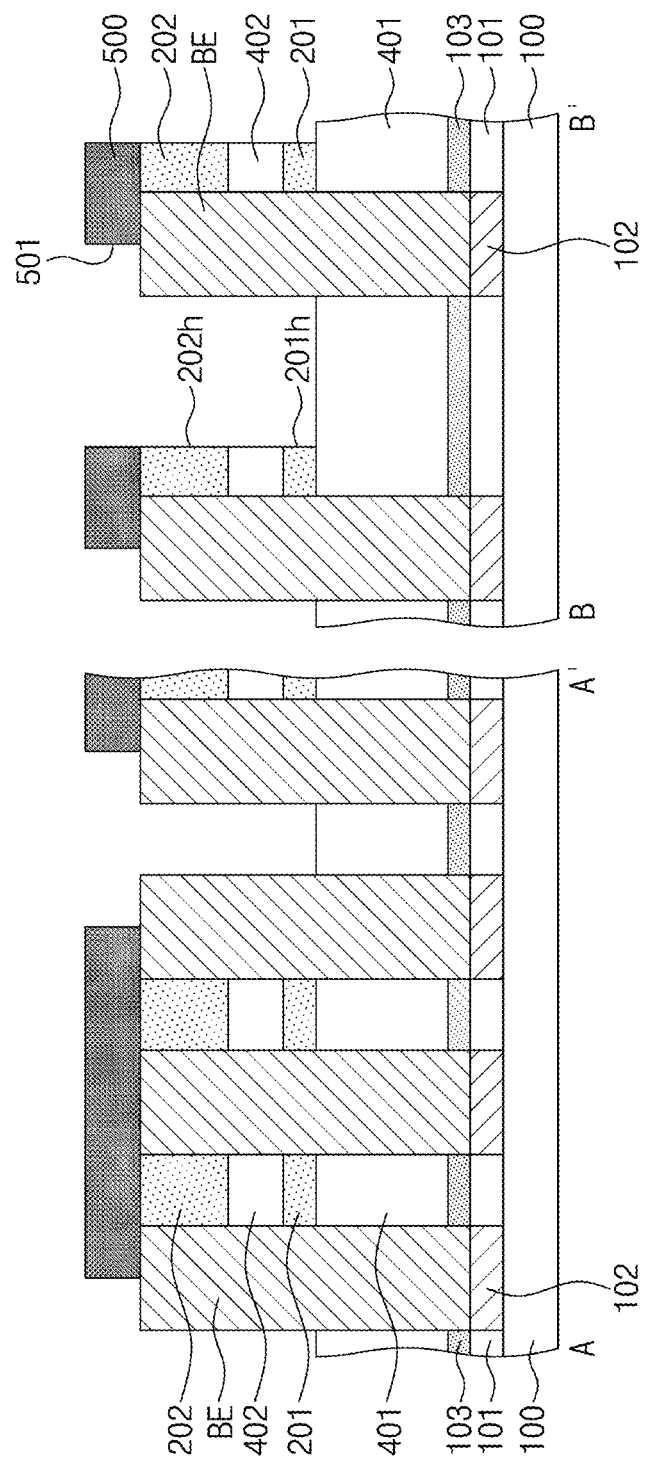

Referring to FIG. 7, the second support layer 212 and/or the first support layer 211 may be patterned to form support patterns 202 and/or 201 including support holes 202h and/or 201h. For example, the mask pattern 500 may be used as an etching mask to perform an etching process. The etching process may include an anisotropic etching process. The etching process may be performed to sequentially pattern the second support layer 212 exposed by the openings 501 of the mask pattern 500, the second sacrificial layer 402 below the second support layer 212, and/or the first support layer 211 below the second sacrificial layer 402. In this step, the support holes 202h and 201h may be formed to expose a top surface of the first sacrificial layer 401. The first support layer 211 may be patterned to form a first support pattern 201 having first support holes 201h. The second support layer 212 may be patterned to form a second support pattern 202 having second support holes 202h. As an anisotropic etching process is performed as the etching process, the first support holes 201h may vertically overlap the second support holes 202h and may have sizes and/or shapes the same as or similar to those of the second support holes 202h. In addition, a lateral surface of the second sacrificial layer 402 may also be exposed.

Figure 8:
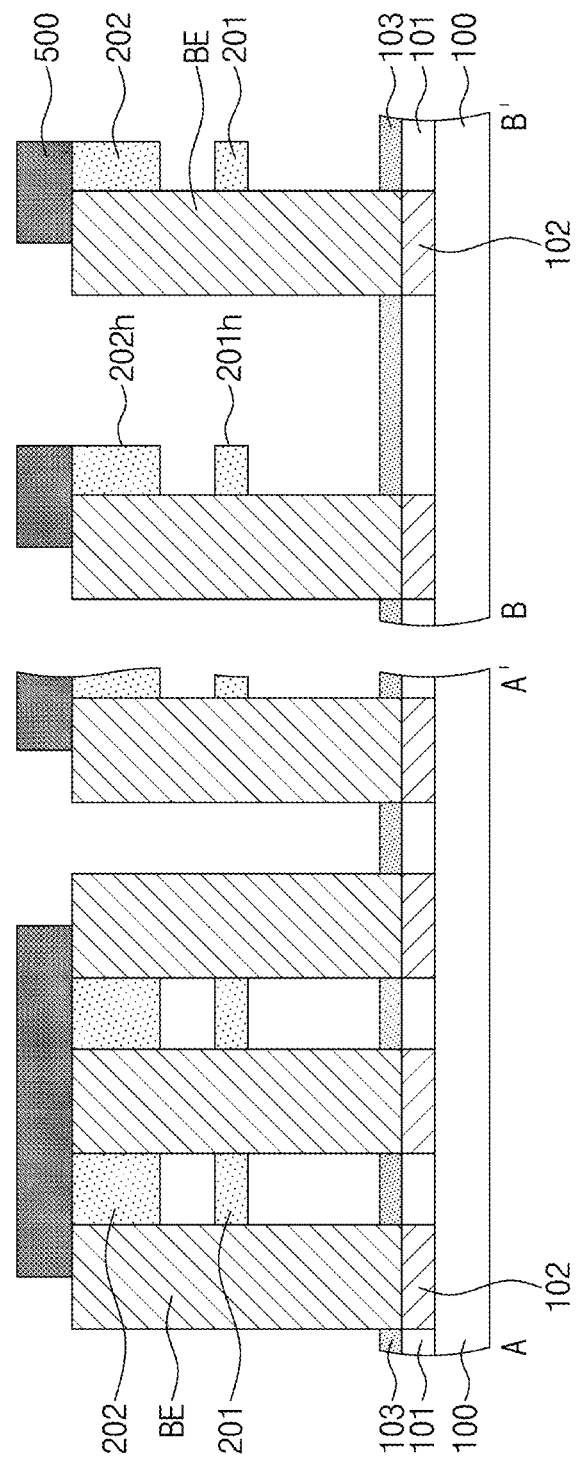

Referring to FIG. 8, the first sacrificial layer 401 and/or the second sacrificial layer 402 may be reduced, or removed. The first sacrificial layer 401 and/or the second sacrificial layer 402 may be reduced, or removed, by an isotropic etching process. For example, an etching solution may be introduced through the first support holes 201h and/or the second support holes 202h, and/or on the exposed lateral surface of the second sacrificial layer 402 and/or the exposed top surface of the first sacrificial layer 401, the first sacrificial layer 401 and/or the second sacrificial layer 402 may react with the etching solution. The removal of the first and/or second sacrificial layers 401 and/or 402 may expose a top surface of the etch stop layer 103, top and bottom surfaces of the first support pattern 201, and/or a bottom surface of the second support pattern 202.

Alternatively, an anisotropic etching process may be performed on the second support layer 212 to form the second support pattern 202 including the second support holes 202h, and then an isotropic etching process may be performed to remove the second sacrificial layer 402 through the second support holes 202h. Afterwards, an anisotropic etching process may be employed to etch the first support layer 211 to form the first support pattern 201 including the first support holes 201h, and then an isotropic etching process may be used to remove the first sacrificial layer 401 through the first support holes 201h.

Figure 9:
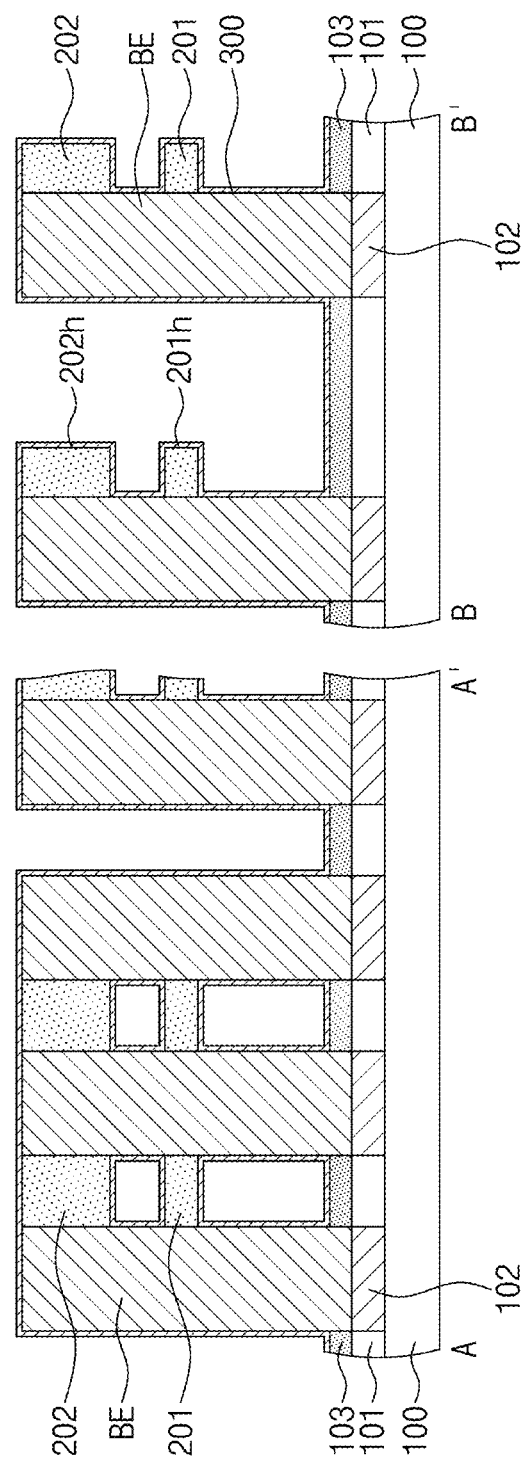

Referring to FIG. 9, the mask pattern (see 500 of FIG. 8) may be reduced, or removed. After the removal of the mask pattern 500, a conductive layer 300 may be deposited to cover exposed surfaces of the bottom electrodes BE, exposed surfaces of the first and/or second support patterns 201 and/or 202, and/or an exposed surfaces of the etch stop layer 103. The exposed surfaces of the bottom electrodes BE may indicate portions of surfaces of the bottom electrodes BE, which surfaces are not covered with any of the first support pattern 201, the second support pattern 202, and/or the etch stop layer 103. The conductive layer 300 may be formed to conformally cover the bottom electrodes BE, the first support pattern 201, second support pattern 202, and/or the etch stop layer 103.

The conductive layer 300 may be deposited by atomic layer deposition. The deposition of the conductive layer 300 may be accomplished by using a self-limiting surface chemical reaction. The deposition of the conductive layer 300 may be achieved by repeating a plurality of process cycles. A single process cycle for depositing the conductive layer 300 may include providing a source gas including a precursor material to adsorb the precursor material on the exposed surfaces of the bottom electrodes BE, the first support pattern 201, the second support pattern 202, and/or the etch stop layer 103, purging the source gas that are not adsorbed on the exposed surfaces of the bottom electrodes BE, the first support pattern 201, the second support pattern 202, and/or the etch stop layer 103, supplying a reaction gas to form the conductive layer 300, and/or purging a remaining reaction gas and byproducts produced during the formation of the conductive layer 300.

The precursor material including metal may be used to deposit the conductive layer 300. The precursor material may include niobium (Nb), tantalum (Ta), tin (Sn), molybdenum (Mo), titanium (Ti), indium (In), nickel (Ni), cobalt (Co), tungsten (W), and/or ruthenium (Ru). The purge may be performed by using an inert gas.

Figure 10:
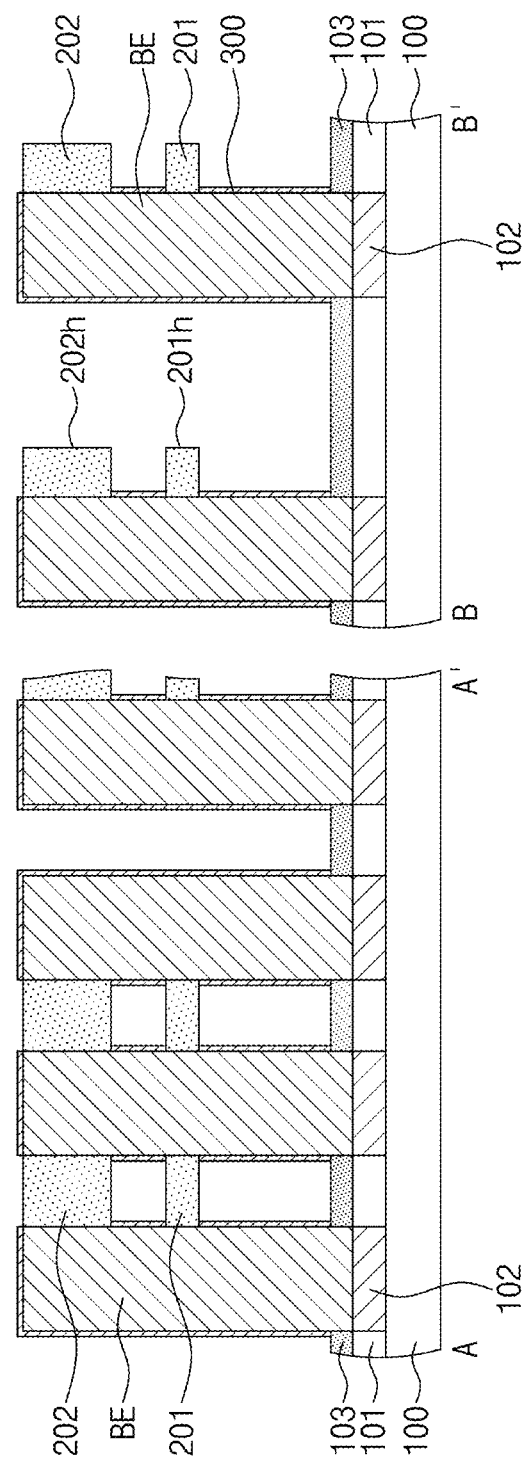

Referring to FIG. 10, the conductive layer 300 may be etched on the first support pattern 201, the second support pattern 202, and/or the etch stop layer 103. The conductive layer 300 deposited on the first support pattern 201 and/or the second support pattern 202 may be etched to expose the surfaces of the first support pattern 201 and/or the second support pattern 202. In addition, the conductive layer 300 deposited on the etch stop layer 103 may be reduced, or removed, to expose the top surface of the etch stop layer 103. The conductive layer 300 deposited on the surfaces of the bottom electrodes BE may not be etched. Alternatively, the conductive layer 300 deposited on the surfaces of the bottom electrodes BE may be etched, and in this case an etching thickness of the conductive layer 300 on the surfaces of the bottom electrodes BE may be less than that of the conductive layer 300 on the surfaces of the first support pattern 201 and/or the second support pattern 202. Therefore, the surfaces of the bottom electrodes BE may not be exposed. After the etching of the conductive layer 300, the conductive layer 300 may surround the surfaces of the bottom electrodes BE except portions of the lateral surfaces of the bottom electrodes BE, which portions of the lateral surfaces are in contact with the first support pattern 201 and/or the second support pattern 202.

The conductive layer 300 may be etched by atomic layer etching. The etching of the conductive layer 300 may be accomplished by using a self-limiting surface chemical reaction. The etching of the conductive layer 300 may be achieved by repeating a plurality of process cycles. A single process cycle for etching the conductive layer 300 may include supplying an etching gas to allow the conductive layer 300 to adsorb the etching gas on a surface thereof, purging the etching gas that are not adsorbed on the surface of the conductive layer 300, supplying a removal gas to remove the conductive layer 300, and/or purging the removal gas and byproducts produced during the removal of the conductive layer 300.

The etching gas may include fluorine (F) and/or chlorine (Cl). The etching gas may be a gaseous compound including fluorine (F), chlorine (Cl), and/or a compound thereof. The etching gas containing fluorine (F) may include $BF_3$, $AlF_3$, $GaF_3$, $InF_3$, $PF_3$, $PF_5$, $AsF_3$, $AsF_5$, $SbF_3$, $SbF_5$, $SiF_4$, $GeF_4$, $TiF_4$, $TaF_5$, $WF_6$, $WOF_4$, $HfF_4$, $CdF_2$, $SeF_6$, $SeF_4$, $TeF_4$, $TeF_6$, $ClF_3$, $NF_3$, $CF_4$, $CHF_3$, $CH_2F_2$, $CH_3F$, $C_2F_6$, $C_4F_5$, $SF_6$, and/or any combination thereof. The etching gas containing chlorine (Cl) may include $BCl_3$, $AlCl_3$, $GaCl_3$, $InCl_3$, $PCl_3$, $PCl_5$, $AsCl_3$, $AsCl_5$, $SbCl_3$, $SbCl_5$, $SiCl_4$, $GeCl_4$, $TiCl_4$, $TaCl_5$, $WCl_6$, $WOCl_4$, $HfCl_4$, $CdCl_2$, $SeCl_6$, $SeCl_4$, $TeCl_4$, $TeCl_6$, $NCl_3$, $CCl_4$, and/or any combination thereof. The purge may be performed by using an inert gas.

A chemical bonding energy between the bottom electrodes BE and the conductive layer 300 may be different from a chemical bonding energy between the first support pattern 201, the second support pattern 202, the etch stop layer 103, and/or the conductive layer 300, and the difference in chemical bonding energy may be caused by the fact that a chemical bonding energy between metal and metal is different from a chemical bonding energy between metal and non-metal. A chemical bonding energy between the bottom electrodes BE and the conductive layer 300 may be greater than a chemical bonding energy between the first support pattern 201, the second support pattern 202, the etch stop layer 103, and/or the conductive layer 300. The difference in chemical bonding energy may allow the conductive layer 300 deposited on the surfaces of the bottom electrodes BE to have an etch selectivity with respect to the conductive layer 300 deposited on the surfaces of the first support pattern 201, the second support pattern 202, and/or the etch stop layer 103. Therefore, the conductive layer 300 deposited on the surfaces of the bottom electrodes BE may be etched at a higher rate than the conductive layer 300 deposited on the surfaces of the first support pattern 201, the second support pattern 202, and/or the etch stop layer 103. As a result, although an entire surface of the conductive layer 300 deposited as discussed with reference to FIG. 9 is exposed to the etching gas, the etch selectivity may cause the conductive layer 300 deposited on the surfaces of the bottom electrodes BE to remain after the etching process while completely, (or substantially), removing the conductive layer 300 deposited on the surfaces of the first support pattern 201, the second support pattern 202, and/or the etch stop layer 103. The etching process of the conductive layer 300 may reduce or remove the conductive layer 300 on the first support pattern 201, the second support pattern 202, and/or the etch stop layer 103 that connect the bottom electrodes BE to each other, which may result in reduction or prevention of electrical short between the bottom electrodes BE.

A deposition process and an etching process of the conductive layer 300 may be performed in the same chamber. The deposition and etching processes may be executed without breaking vacuum. The etching process of the conductive layer 300 may be in-situ performed after the deposition process of the conductive layer 300. The deposition and etching processes of the conductive layer 300 may be performed alternately and repeatedly. The deposition and etching processes of the conductive layer 300 may be performed alternately and repeatedly in the same chamber to simplify process and to reduce cost in fabricating a semiconductor device.

Figure 11:
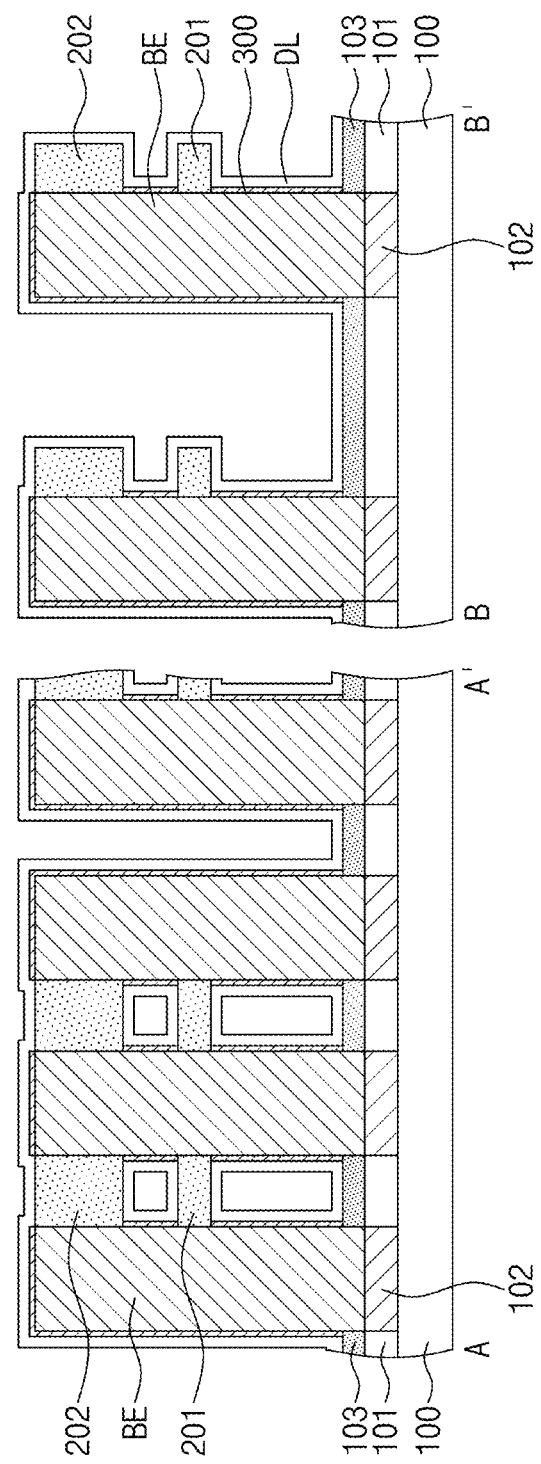

Referring to FIG. 11, a dielectric layer DL may be formed on the conductive layer 300, the first support pattern 201, the second support pattern 202, and/or the etch stop layer 103. The dielectric layer DL may be formed to have a uniform thickness on the conductive layer 300, the first support pattern 201, the second support pattern 202, and/or the etch stop layer 103. The dielectric layer DL may be the same as the dielectric layer DL discussed with reference to FIG. 2. A small amount of fluorine (F) and/or chlorine (Cl) that remains in the etching process may be present at an interface between the dielectric layer DL and the conductive layer 300.

Referring back to FIG. 2, a top electrode TE may be formed on the dielectric layer DL. For example, the top electrode TE may be formed by depositing and/or coating a conductive material on an entire surface of the semiconductor substrate 100. On the dielectric layer DL, the top electrode TE may be formed to cover the bottom electrodes BE. The dielectric layer DL may separate the top electrode TE from the bottom electrodes BE.

Figure 12:
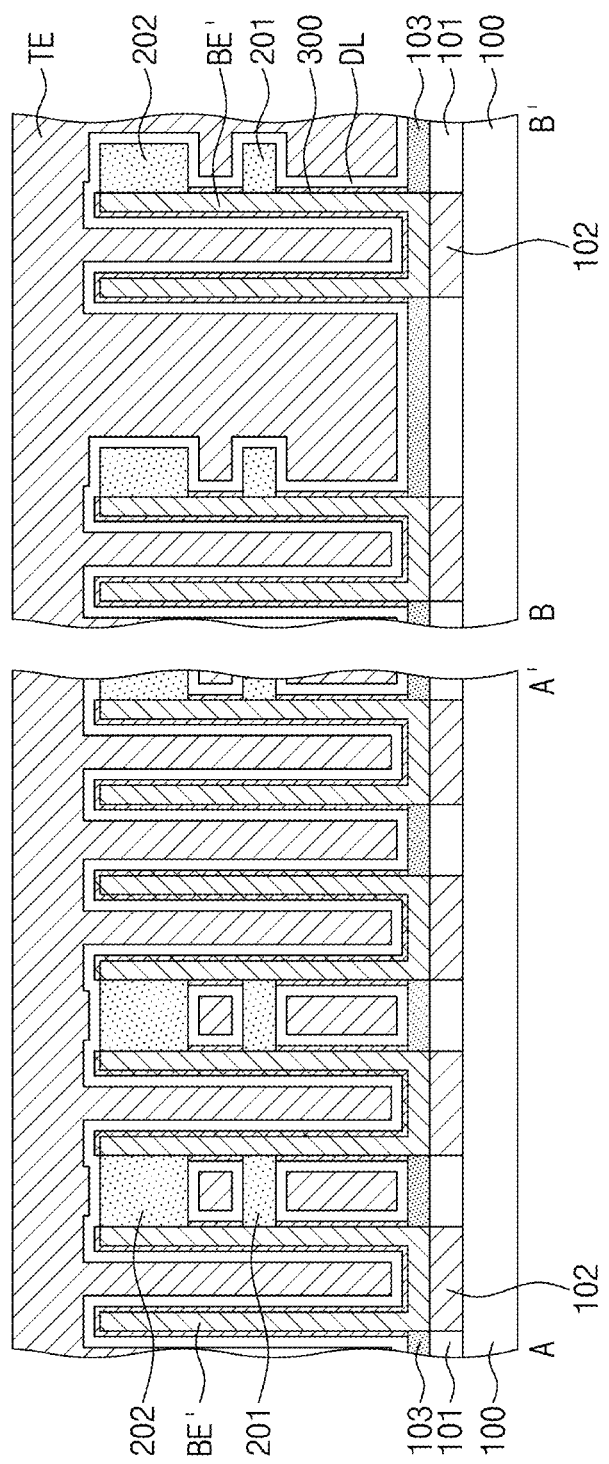
FIG. 12 illustrates a cross-sectional view showing a semiconductor device according to some example embodiments of the present inventive concepts.

FIG. 12 illustrates a cross-sectional view showing a semiconductor device according to some example embodiments of the present inventive concepts. In the following description of example embodiments, a duplicate description of components discussed above with reference to FIG. 2 will be omitted, and a difference thereof will be discussed in detail. The same reference numerals may be allocated to components the same as those of the semiconductor device discussed above according to some example embodiments of the present inventive concepts.

Referring to FIG. 12, each, or one or more, of bottom electrodes BE' may be provided in the form of a hollow cup or a cylinder. The conductive layer 300 may cover top surfaces, inner sidewalls, and/or outer sidewalls of the bottom electrodes BE', which outer sidewalls are not in contact with any of the support patterns 201 and/or 202. The dielectric layer DL may be formed to cover the conductive layer 300. The dielectric layer DL may be formed to cover the support patterns 201 and/or 202 and/or the conductive layer 300 on the top surfaces, the inner sidewalls, and/or the outer sidewalls of the bottom electrodes BE' that are not in contact with any of the support patterns 201 and/or 202. The top electrode TE may be provided on the dielectric layer DL. Portions of the top electrode TE may extend into internal empty spaces of the bottom electrodes BE'.

Figure 13:
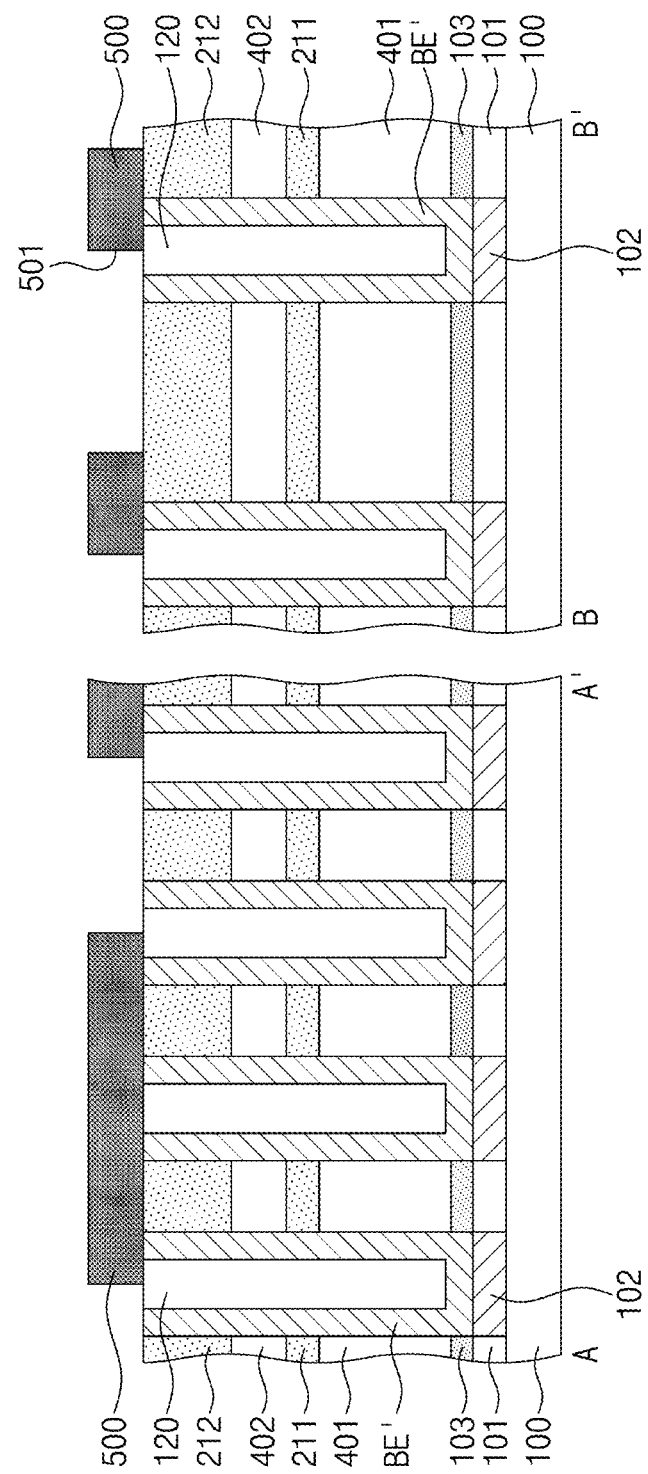
FIG. 13 illustrates a cross-sectional view showing a method of fabricating a semiconductor device according to some example embodiments of the present inventive concepts.

FIG. 13 illustrates a cross-sectional view showing a method of fabricating the semiconductor device of FIG. 12.

Referring to FIG. 13, in the step discussed with reference to FIG. 4, an electrode material layer (not shown) may be formed to have a uniform thickness on the semiconductor substrate 100 to cover bottom and lateral surfaces of the bottom electrode holes H. In this step, the thickness of the electrode material layer may be relatively small compared to a diameter of the hole H not to allow the electrode material layer to completely, (or substantially), fill the bottom electrode holes H. A sacrificial material 120 may be formed on the electrode material layer to fill unoccupied portions of the bottom electrode holes H. Thereafter, an etch-back and/or chemical mechanical polishing (CMP) process may be performed on the sacrificial material 120 and/or the electrode material layer to expose the second support layer 212 and to leave the sacrificial material 120 and/or portions of the electrode material layer in the bottom electrode holes H. The portions of the electrode material layer, which is left in the bottom electrode holes H may each constitute the bottom electrode BE'.

The same process discussed with reference to FIGS. 7 to 11 may be performed subsequently. In the step discussed with reference to FIG. 8, the sacrificial material 120 may be reduced, or removed, simultaneously with the removal of the sacrificial layers 401 and/or 402, and inner sidewalls of the bottom electrodes BE' may be exposed. Therefore, in the process for forming the conductive layer 300 of FIG. 9, the conductive layer 300 may also be formed on the inner sidewalls of the bottom electrodes BE'. The deposition and etching process of the conductive layer (see 300 of FIG. 12), the formation process of the conductive layer (see DL of FIG. 12), and the formation process of the top surface (see TE of FIG. 12) may be the same as or similar to those discussed above.

Figure 14:
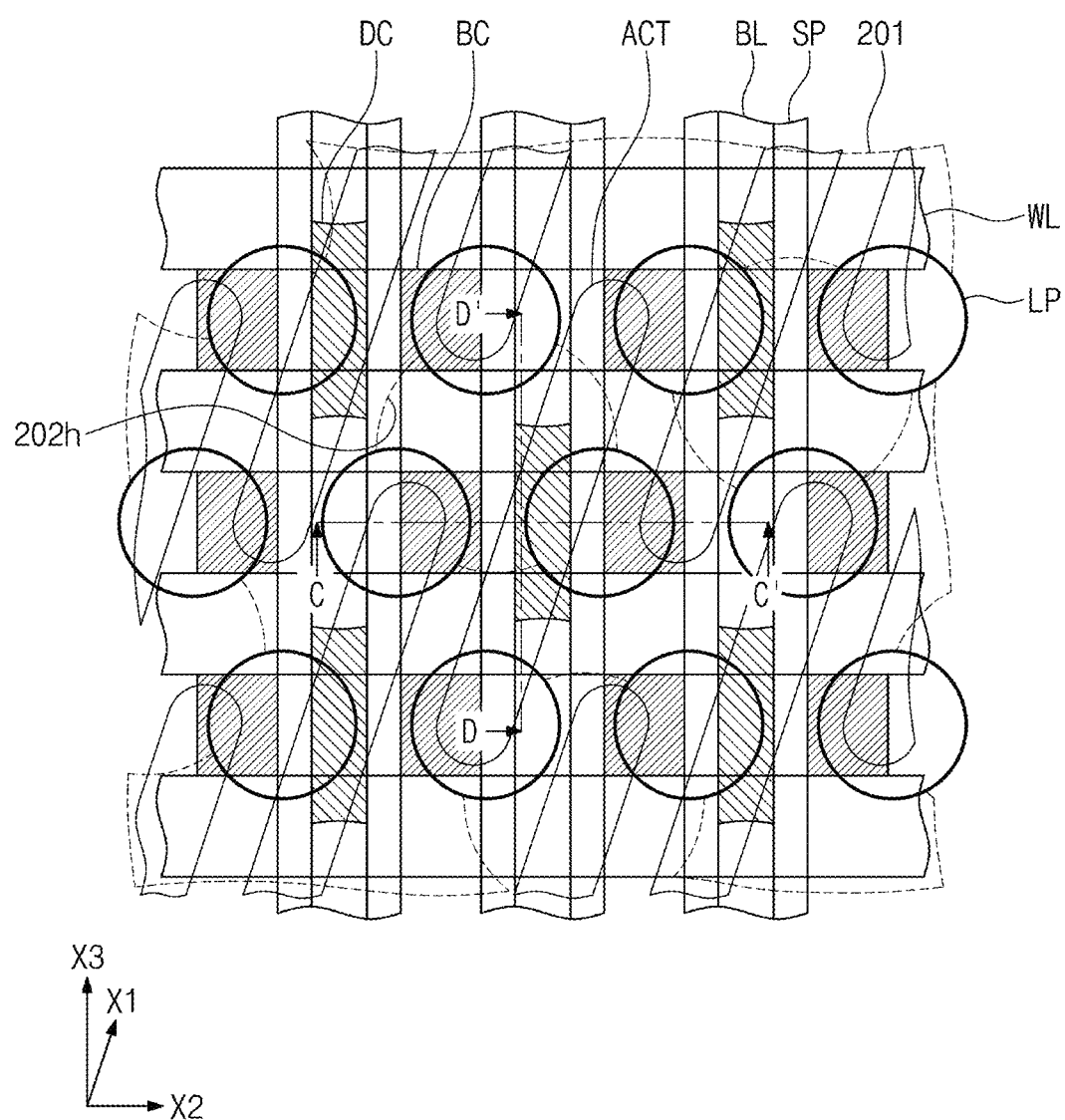
FIG. 14 illustrates a plan view showing a semiconductor device according to some example embodiments of the present inventive concepts.
Figure 15:
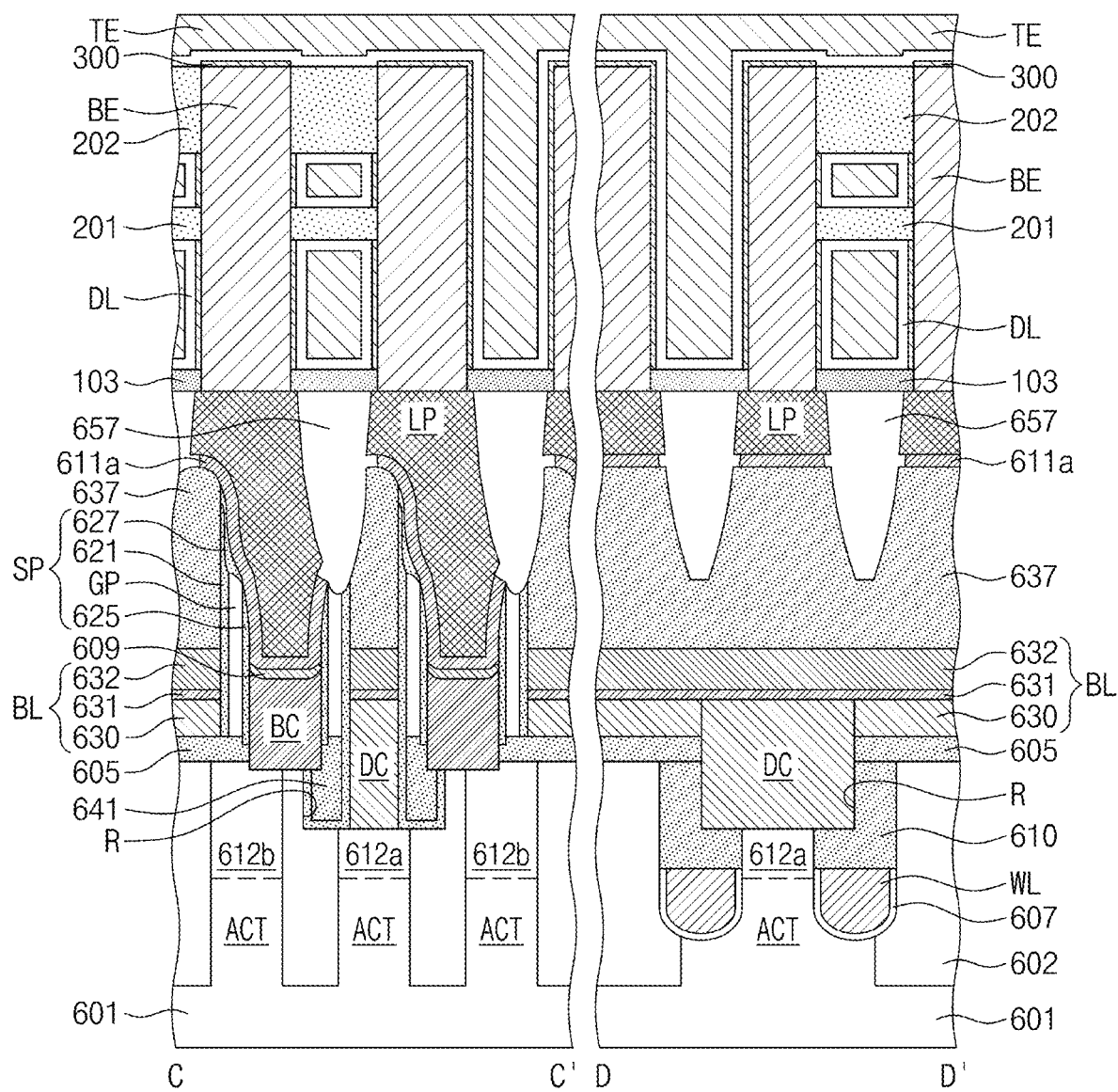
FIG. 15 illustrates a cross-sectional view taken along lines C-C' and D-D' of FIG. 14, showing a semiconductor device according to some example embodiments of the present inventive concepts.

FIG. 14 illustrates a cross-sectional view showing a semiconductor device according to some example embodiments of the present inventive concepts. FIG. 15 illustrates a cross-sectional view taken along lines C-C' and D-D' of FIG. 14, showing a semiconductor device according to some example embodiments of the present inventive concepts.

Referring to FIGS. 14 and 15, a substrate 601 may be provided therein device isolation patterns 602 that define active sections ACT. Each, or one or more, of the active sections ACT may have an isolated shape. Each, or one or more, of the active sections ACT may have a bar shape elongated in a first direction X1 when viewed in plan. When viewed in plan, the active sections ACT may correspond to portions of the substrate 601 that are surrounded by the device isolation patterns 602. The substrate 601 may include a semiconductor material. The active sections ACT may be arranged in parallel to each other in the first direction X1 such that one of the active sections ACT may have an end adjacent to a center of a neighboring one of the active sections ACT.

Word lines WL may run across the active sections ACT. The word lines WL may be disposed in grooves formed in the device isolation patterns 602 and the active sections ACT. The word lines WL may be parallel to a second direction X2 that intersects the first direction X1. The word lines WL may be formed of a conductive material. A gate dielectric layer 607 may be disposed between each, or one or more, of the word lines WL and an inner surface of each, or one or more, groove. Although not shown, the grooves may have their bottom surfaces located relatively deeper in the device isolation patterns 602 and relatively shallower in the active sections ACT. The gate dielectric layer 607 may include at least one selected from thermal oxide, silicon nitride, silicon oxynitride, and/or high-k dielectric. Each, or one or more, of the word lines WL may have a curved bottom surface.

A first doped region 612a may be disposed in each, or one or more, active section ACT between a pair of word lines WL, and a pair of second doped regions 612b may be disposed in opposite edge regions of each, or one or more, active section ACT. The first and/or second doped regions 612a and/or 612b may be doped with, for example, N-type impurities. The first doped region 612a may correspond to a common drain region, and the second doped regions 612b may correspond to source regions. A transistor may be constituted by each, or one or more, of the word lines WL and its adjacent first and/or second doped regions 612a and/or 612b. As the word lines WL are disposed in the grooves, each, or one or more, of the word lines WL may have thereunder a channel region whose channel length becomes increased within a limited planar area. Accordingly, a short-channel effect may be minimized.

The word lines WL may have top surfaces lower than those of the active sections ACT. A word-line capping pattern 610 may be disposed on each, or one or more, word line WL. The word-line capping patterns 610 may have their linear shapes that extend along longitudinal directions of the word lines WL, and may cover entire top surfaces of the word lines WL. The grooves may have inner spaces not occupied by the word lines WL, and the word-line capping patterns 610 may fill the unoccupied inner spaces of the grooves. The word-line capping patterns 610 may be formed of, for example, silicon nitride.

An interlayer dielectric pattern 605 may be disposed on the substrate 601. The interlayer dielectric pattern 605 may include a silicon oxide layer, a silicon nitride layer, a silicon oxynitride layer, and/or multiple layers thereof. The interlayer dielectric pattern 605 may be formed to have island shapes that are spaced apart from each other when viewed in plan. The interlayer dielectric pattern 605 may be formed to simultaneously cover ends of two adjacent active sections ACT.

The substrate 601, the device isolation pattern 602, and/or an upper portion of the word-line capping pattern 610 may be partially recessed to form a recess region R. The recess region R may constitute a net shape when viewed in plan. A sidewall of the recess region R may be aligned with that of the interlayer dielectric pattern 605.

Bit lines BL may be disposed on the interlayer dielectric pattern 605. The bit lines BL may run across the word-line capping patterns 610 and the word lines WL. As shown in FIG. 14, the bit lines BL may be in parallel to a third direction X3 that intersect the first and second directions X1 and X2. The bit lines BL may each include a bit-line polysilicon pattern 630, a bit-line ohmic pattern 631, and/or a bit-line metal-containing pattern 632 that are sequentially stacked. The bit-line polysilicon pattern 630 may include impurity-doped polysilicon and/or impurity-undoped polysilicon. The bit-line ohmic pattern 631 may include metal silicide. The bit-line metal-containing pattern 632 may include at least one of metal (e.g., tungsten, titanium, and/or tantalum) and/or conductive metal nitride (e.g., titanium nitride, tantalum nitride, and/or tungsten nitride). A bit-line capping pattern 637 may be disposed on each, or one or more, of the bit lines BL. The bit-line capping patterns 637 may be formed of a dielectric material, such as silicon nitride.

Bit-line contacts DC may be disposed in the recess region R that intersects the bit lines BL. The bit-line contacts DC may include impurity-doped polysilicon and/or impurity-undoped polysilicon. When viewed in cross-section taken along line D-D' as illustrated in FIG. 15, the bit-line contact DC may have a sidewall in contact with that of the interlayer dielectric pattern 605. When viewed in plan as shown in FIG. 14, the bit-line contact DC may have a concave sidewall in contact with the interlayer dielectric pattern 605. The bit-line contact DC may electrically connect the first doped region 612a and the bit line BL to each other.

The recess region R may have an empty space not occupied by the bit-line contact DC, and a lower buried dielectric pattern 641 may be disposed in the empty space of the recess region R. The lower buried dielectric pattern 641 may be formed of a silicon oxide layer, a silicon nitride layer, a silicon oxynitride layer, and/or multiple layers thereof.

Storage node contacts BC may be disposed between a pair of neighboring bit lines BL. The storage node contacts BC may be spaced apart from each other. The storage node contacts BC may include impurity-doped polysilicon and/or impurity-undoped polysilicon. The storage node contacts BC may have their concave top surfaces. A dielectric pattern (not shown) may be disposed between the storage node contacts BC and between the bit lines BL.

A bit-line spacer SP may be interposed between the bit line BL and the storage node contact BC. The bit-line spacer SP may include a first sub-spacer 621 and/or a second sub-spacer 625 that are spaced apart from each other across a gap region GP. The gap region GP may be called an air gap. The first sub-spacer 621 may cover a sidewall of the bit line BL and a sidewall of the bit-line capping pattern 637. The second sub-spacer 625 may be adjacent to the storage node contact BC. The first sub-spacer 621 and/or the second sub-spacer 625 may include the same material. For example, the first sub-spacer 621 and/or the second sub-spacer 625 may include silicon nitride.

The second sub-spacer 625 may have a bottom surface lower than that of the first sub-spacer 621. The second sub-spacer 625 may have a top end whose height is less than that of a top end of the first sub-spacer 621. Such a configuration may increase a formation margin for landing pads LP which will be discussed below. As a result, the landing pad LP and the storage node contact BC may be prevented from being disconnected to each other. The first sub-spacer 621 may extend to cover the sidewall of the bit-line contact DC and a sidewall and a bottom surface of the recess region R. For example, the first sub-spacer 621 may be interposed between the bit-line contact DC and the lower buried dielectric pattern 641, between the word-line capping pattern 610 and the lower buried dielectric pattern 641, between the substrate 601 and the lower buried dielectric pattern 641, and/or between the device isolation pattern 602 and the lower buried dielectric pattern 641.

A storage node ohmic layer 609 may be disposed on the storage node contact BC. The storage node ohmic layer 609 may include metal silicide. The storage node ohmic layer 609, the first and/or second sub-spacers 621 and/or 625, and/or the bit-line capping pattern 637 may be conformally covered with a diffusion stop pattern 611a whose thickness is uniform. The diffusion stop pattern 611a may include metal nitride, such as titanium nitride or tantalum nitride. A landing pad LP may be disposed on the diffusion stop pattern 611a. The landing pads LP may correspond to the bottom electrode contacts 102 of FIG. 2. The landing pad LP may be formed of a material containing metal such as tungsten. The landing pad LP may have an upper portion that covers a top surface of the bit-line capping pattern 637 and has a width greater than that of the storage node contact BC. A center of the landing pad LP may be shifted in the second direction X2 away from a center of the storage node contact BC. A portion of the bit line BL may vertically overlap the landing pad LP. An upper sidewall of the bit-line capping pattern 637 may overlap the landing pad LP and may be covered with a third sub-spacer 627. A pad isolation pattern 657 may be interposed between the landing pads LP. The pad isolation pattern 657 may correspond to the interlayer dielectric layer 101 of FIG. 2. The pad isolation pattern 657 may include a silicon nitride layer, a silicon oxide layer, a silicon oxynitride layer, and/or a porous layer. The pad isolation pattern 657 may define a top end of the gap region GP.

Bottom electrodes BE may be correspondingly disposed on the landing pads LP. The bottom electrodes BE may correspond to the bottom electrodes BE discussed with reference to FIG. 2. For example, partial sidewalls of the bottom electrodes BE may be connected to each other through first and/or second support patterns 201 and/or 202. The first and second support patterns 201 and/or 202 may have a plurality of support holes 201h and/or 202h.

A top surface of the pad isolation pattern 657 may be covered with an etch stop layer 103 between the bottom electrodes BE. The etch stop layer 103 may include a dielectric material, such as silicon nitride, silicon oxide, and/or silicon oxynitride. A conductive layer 300 may cover surfaces of the bottom electrodes BE, which surfaces are not in contact with any of the first and/or second support patterns 201 and/or 202. A dielectric layer DL may cover a surface of the conductive layer 300 and/or surfaces of the support patterns 201 and/or 202. The dielectric layer DL may be covered with a top electrode TE. Other configurations may be identical or similar to those of the semiconductor device discussed with reference to FIG. 2 according to some example embodiments of the present inventive concepts.

In a method of fabricating a semiconductor device according to some example embodiments of the present inventive concepts, a deposition and etching of a conductive layer may be performed in the same chamber, and the deposited conductive layer may be selectively etched to allow the conductive layer to remain only on a surface of a bottom electrode in a capacitor. Therefore, because it is not required to additionally perform a process that removes the conductive layer on an undesired region, it may be possible to simplify process and to increase yield.

Although the present inventive concepts have been described in connection with some example embodiments of the present inventive concepts illustrated in the accompanying drawings, it will be understood by one of ordinary skill in the art that variations in form and detail may be made therein without departing from the spirit and essential feature of the present inventive concepts. The above disclosed some example embodiments should thus be considered illustrative and not restrictive.

What is claimed is:

1. A method of fabricating a semiconductor device, the method comprising:

sequentially stacking a sacrificial layer and a support layer on a substrate;

forming bottom electrodes penetrating the sacrificial layer and the support layer to come into contact with the substrate;

patterning the support layer to form a support pattern that connects the bottom electrodes to each other;

removing the sacrificial layer to expose surfaces of the bottom electrodes;

depositing a conductive layer on the exposed surfaces of the bottom electrodes and a surface of the support pattern; and etching the conductive layer, wherein the etching the conductive layer includes selectively removing the conductive layer on the support pattern to expose the surface of the support pattern, and wherein the depositing the conductive layer and the etching the conductive layer are alternately performed in a same chamber.

2. The method of claim 1, wherein, the patterning the support layer includes forming the support pattern in contact with portions of lateral surfaces of the bottom electrodes, and the etching the conductive layer includes etching the conductive layer such that remaining lateral surfaces of the bottom electrodes are surrounded by the conductive layer, the remaining lateral surfaces of the bottom electrodes excluding the portions of lateral surfaces of the bottom electrodes.

3. The method of claim 1, further comprising:

forming a dielectric layer that surrounds the bottom electrodes, the support pattern, and the conductive layer; and forming a top electrode on the dielectric layer.

4. The method of claim 3, wherein the forming the dielectric layer forms the dielectric layer spaced apart from the bottom electrode with the conductive layer interposed therebetween.

5. The method of claim 1, wherein an etch rate of the conductive layer is higher on the surface of the support pattern than on the exposed surfaces of the bottom electrodes.

6. The method of claim 1, wherein the etching the conductive layer etches the conductive layer with a gaseous compound including at least one of fluorine (F) or chlorine (Cl).

7. The method of claim 1, wherein the depositing the conductive layer deposits the conductive layer by atomic layer deposition, and the etching the conductive layer etches the conductive layer by atomic layer etching.

8. The method of claim 1, wherein the conductive layer includes at least one of niobium (Nb), tantalum (Ta), tin (Sn), molybdenum (Mo), titanium (Ti), indium (In), nickel (Ni), cobalt (Co), tungsten (W), or ruthenium (Ru).

9. A method of fabricating a semiconductor device, the method comprising:

providing a dielectric layer including an opening on a substrate;

forming bottom electrode contacts in the opening of the dielectric layer, the bottom electrode contacts being in contact with a top surface of the substrate;

sequentially stacking a first sacrificial layer, a first support layer, a second sacrificial layer, and a second support layer on the dielectric layer;

forming bottom electrodes penetrating the first sacrificial layer, the first support layer, the second sacrificial layer, and the second support layer to come into contact with the bottom electrode contacts;

forming a mask on the second support layer to pattern the second support layer, the second sacrificial layer, and the first support layer;

removing the first sacrificial layer and the second sacrificial layer to expose the bottom electrodes;

depositing a conductive layer on surfaces of the bottom electrodes, a surface of the first support layer, and a surface of the second support layer;

performing an etching process on the conductive layer, the etching process being in-situ performed after the conductive layer is deposited;

forming a capacitor dielectric layer surrounding the first support layer, the second support layer, and the conductive layer; and forming a top electrode on the capacitor dielectric layer, wherein, after depositing the conductive layer and etching the conductive layer, the conductive layer remains on the surfaces of the bottom electrode, and the conductive layer is removed from the surface of the first support layer and the surface of the second support layer, and wherein etching the conductive layer is performed with a gaseous compound including at least one of fluorine (F) or chlorine (Cl).

10. The method of claim 9, wherein the depositing the conductive layer and the etching the conductive layer are performed in a same chamber.

11. The method of claim 9, wherein the sequentially stacking stacks the first support layer and the second support layer vertically spaced apart from each other, and the forming the bottom electrodes forms the bottom electrodes such that the first support layer and the second support layer connect the bottom electrodes to each other.

12. The method of claim 9, wherein the depositing the conductive layer deposits the conductive layer by atomic layer deposition, and the etching the conductive layer etches the conductive layer by atomic layer etching.

13. The method of claim 9, wherein an etch rate of the conductive layer on the first support layer and the second support layer is higher than an etch rate of the conductive layer on the bottom electrode.

14. The method of claim 9, wherein the forming the capacitor dielectric layer forms the capacitor dielectric layer such that the conductive layer is between the bottom electrode and the capacitor dielectric layer.

15. The method of claim 9, wherein the conductive layer includes at least one of niobium (Nb), tantalum (Ta), tin (Sn), molybdenum (Mo), titanium (Ti), indium (In), nickel (Ni), cobalt (Co), tungsten (W), or ruthenium (Ru).

16. A method of fabricating a semiconductor device, the method comprising:

stacking a sacrificial layer and a support layer on a substrate;

forming bottom electrodes penetrating the sacrificial layer and the support layer;

patterning the support layer to form a support pattern;

removing the sacrificial layer to expose the bottom electrodes;

depositing a conductive layer on surfaces of the bottom electrodes and a surface of the support pattern;

etching the conductive layer to expose the surface of the support pattern; and forming a dielectric layer on an exposed surface of the conductive layer and the exposed surface of the support pattern, wherein the depositing the conductive layer deposits the conductive layer by atomic layer deposition, wherein etching the conductive layer etches the conductive layer by atomic layer etching, and wherein an etch rate of the conductive layer on the support pattern is higher than an etch rate of the conductive layer on the bottom electrode.

17. The method of claim 16, wherein the patterning the support pattern patterns the support pattern such that portions of lateral surfaces of the bottom electrodes are in contact with the support pattern, and the depositing the conductive layer deposits the conductive layer such that surfaces of the bottom electrodes not in contact with the support pattern are surrounded by the conductive layer.

18. The method of claim 16, wherein the etching the conductive layer and the depositing the conductive layer are alternately performed in a same chamber.

19. The method of claim 16, wherein the etching the conductive layer includes etching the conductive layer with a gaseous compound including at least one of fluorine (F) or chlorine (Cl).

20. The method of claim 16, further comprising:

forming a top electrode on the dielectric layer after etching the conductive layer.

* * * * *